United States Patent
Clarke et al.

(10) Patent No.: US 7,015,692 B2
(45) Date of Patent: Mar. 21, 2006

(54) APPARATUS FOR ACTIVE COOLING OF AN MRI PATIENT BORE IN CYLINDRICAL MRI SYSTEMS

(75) Inventors: Neil Clarke, Florence, SC (US); Michael B. Sellers, Florence, SC (US); Michael L. Allford, Florence, SC (US); Anthony Mantone, Florence, SC (US)

(73) Assignee: GE Electric Company, Schenectady, NY (US)

( * ) Notice: Subject to any disclaimer, the term of this patent is extended or adjusted under 35 U.S.C. 154(b) by 0 days.

(21) Appl. No.: 10/604,654

(22) Filed: Aug. 7, 2003

(65) Prior Publication Data
US 2005/0030028 A1    Feb. 10, 2005

(51) Int. Cl.
G01V 3/00    (2006.01)

(52) U.S. Cl. .................. 324/300; 324/315; 324/318; 324/319

(58) Field of Classification Search ........... 324/318, 324/322, 315, 319; 335/216, 299; 600/422
See application file for complete search history.

(56) References Cited

U.S. PATENT DOCUMENTS

| 5,492,122 | A | * | 2/1996 | Button et al. ............... 600/411 |
| 5,680,086 | A | * | 10/1997 | Allis et al. ................... 335/296 |
| 5,793,209 | A | * | 8/1998 | Kondo et al. ................ 324/318 |
| 6,100,693 | A | | 8/2000 | Eberler et al. |
| 6,361,661 | B1 | | 3/2002 | Hong |
| 6,538,440 | B1 | | 3/2003 | Dean et al. |
| 6,812,705 | B1 | | 11/2004 | Sellers |
| 6,825,664 | B1 | * | 11/2004 | Kwok et al. ................ 324/318 |
| 6,906,517 | B1 | * | 6/2005 | Huang et al. ................ 324/315 |
| 6,909,283 | B1 | * | 6/2005 | Emeric et al. .............. 324/300 |
| 2002/0073717 | A1 | * | 6/2002 | Dean et al. .................. 62/50.7 |

FOREIGN PATENT DOCUMENTS

| JP | 2002159465 | 6/2002 |
| JP | 2002345775 | 12/2002 |

\* cited by examiner

Primary Examiner—Anh Mai
(74) Attorney, Agent, or Firm—Henry Policinski; Joseph S. Heino; Patrick M. Bergin

(57) ABSTRACT

The present invention provides for a cooling system for circulating a coolant to cool the patient bore. In one embodiment, that patient bore consists of two concentric cylinders separated by spacers running either longitudinally or helically. In another embodiment of the present invention, fluid may be passed either helically or longitudinally through tubes bonded to the outer diameter of the patient bore such that the parts of the bore that are exposed to the patient are directly cooled. In a third embodiment, the RF coil could form part of the patient bore, with the helical or longitudinal fluid channels surrounding the patient bore.

6 Claims, 5 Drawing Sheets

FIG. 4
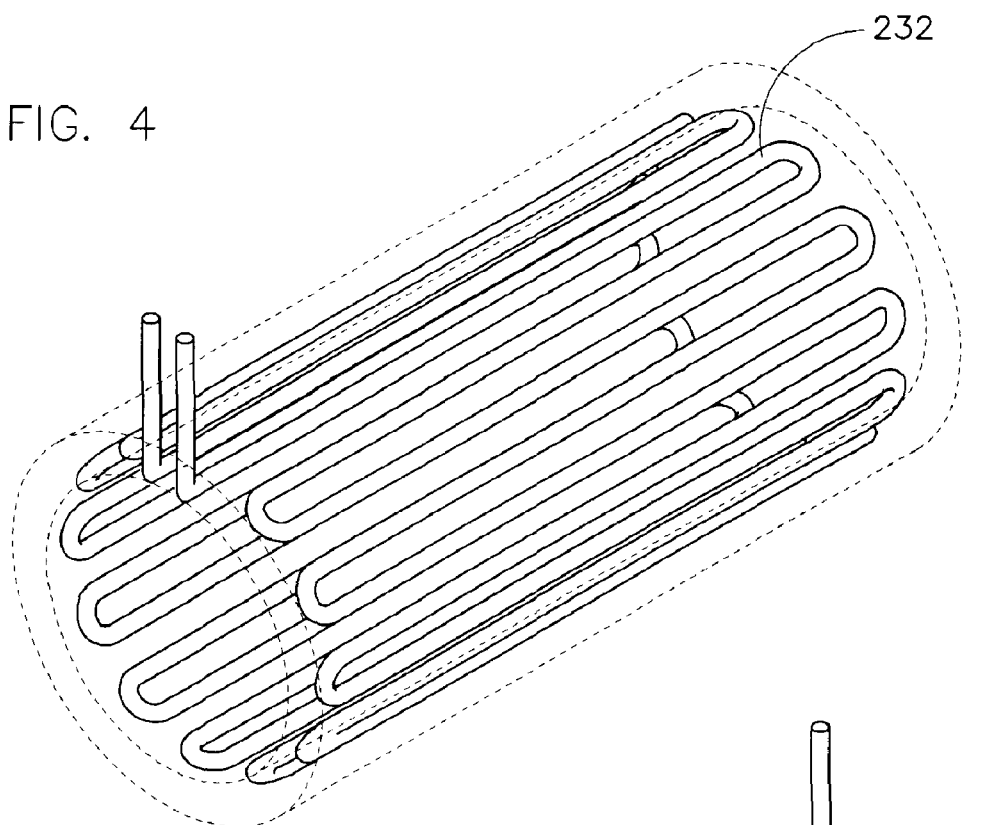
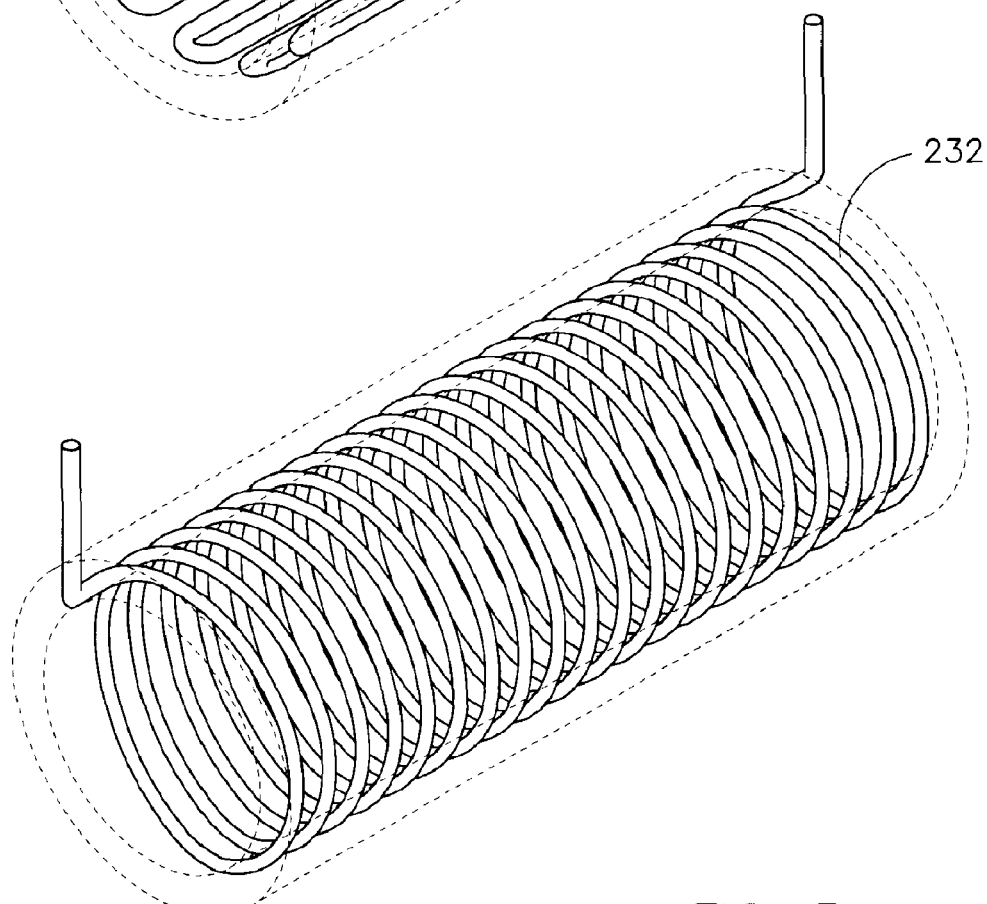
FIG. 5

APPARATUS FOR ACTIVE COOLING OF AN MRI PATIENT BORE IN CYLINDRICAL MRI SYSTEMS

BACKGROUND OF INVENTION

The present invention relates generally to magnetic resonance imaging (MRI) systems, and more particularly to an assembly designed to dissipate the heat generated by the gradient coils and RF coils that are used in MRI.

When a substance such as human tissue is subjected to a uniform magnetic field (polarizing field $B_0$), the individual magnetic moments of the spins in the tissue attempt to align with the polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$ may be rotated, or "tipped", into the x-y plane to produce a net transverse magnetic movement $M_t$. A signal is emitted by the excited spins after the excitation signal $B_1$ is terminated and this signal may be received and processed to form an image.

During patient scans, the gradient coils that produce the aforementioned magnet field dissipate large amounts of heat, typically in the order of tens of kilowatts. The majority of this heat is generated by resistive heating of the copper electrical conductors that form x, y, and z axis gradient coils when these coils are energized. The amount of heat generated is in direct proportion to the electrical power supplied to the gradient coils. The large power dissipation not only results in an increase in temperature to the gradient coil, the heat produced is distributed within the gradient coil assembly or resonance modules and influences the temperature in two other critical regions. These two regions are located at boundaries of the gradient assembly and include the patient bore surface and warm bore surface adjacent to the cryostat that houses the magnets. Each of these three regions has a specific maximum temperature limitation. In the resonance module, there are material temperature limitations such as the glass transition temperature. That is, although the copper and fiber reinforced backing of the coils can tolerate temperatures in excess of 120° C., the epoxy that is used to bond the layers together typically has a much lower maximum working temperature of approximately from 70° to 100° C. Regulatory limits mandate a peak temperature on the patient or surface of 41° C. The warm bore surface also has a maximum temperature that is limited to approximately 40° C. to prevent excessive heat transfer through the warm bore surface into the cryostat. Further, temperature variations of more than 20° C. can cause field homogeneity variations due to a temperature dependence of the field shim material that exhibits a magnetic property variation with temperature.

High current levels employed in conventional gradient coils produce significant heat proximate to the coil. This heat must be carried away from the coil and the magnet bore region to prevent damage to the coil and related structure, to avoid unwanted changes in the magnetic field due heating of magnet components, and to prevent unacceptable heating of a patient or other subject in the bore.

Cooling systems for gradient coils generally rely on conduction of the heat generated in the active circuits of the coil to water carrying pipes at some distance from the gradient coil, possibly as much as 10 mm away. The space between the active circuits and the water pipes is usually of material with good insulation properties, such as fiber-glass, making heat conduction inefficient. The water carrying pipes are also radially outward of the coil heat regions resulting in the hottest regions being nearest to the patient being scanned with no cooling directly between the hot regions and the patient. The resulting heat generation puts thermal limits on the operation of the coil. In general, increased peak strengths and high patient throughput are driving up operating currents and voltages. The increases in operating currents are generating additional heat loads surpassing the ability of existing thermal systems.

In general, prior devices have employed some form of coolant, usually water or ethylene glycol, and have provided thermal insulation. However, newer imaging protocols use higher power levels and further efforts are required to allow these advanced studies without exceeding temperature limits. Other devices have employed air cooling methods, with air being blown directly into the patient bore. The main limitation in this method is that patients frequently complain of being too cold. Yet another disadvantage is that the amount of air flow can vary significantly depending on the size of the patient so that in some cases insufficient or irregular flow will not cool the patient at all.

SUMMARY OF INVENTION

RF coils create the $B_1$ field which rotates the net magnetization in a pulse sequence. They also detect the transverse magnetization as it precesses in the XY plane. In order to create the $B_1$ field, current is then passed though the RF coil to generate a magnetic field. The resistive heating caused by large current flow causes patient discomfort and, in extreme cases, can cause burns. It is, therefore, an object to provide such an apparatus that, in addition to preserving the electrical and magnetic properties of the RF coil, increases patient comfort by reducing the heat load in the patient bore.

The present invention has obtained this object. The present invention provides a patient bore assembly and RF coil with a cooling system for the RF coil comprising an inner cylinder, an outer cylinder, and a plurality of longitudinal spacers arranged between the cylinders such that a plurality of coolant passageways are created. A similar embodiment of the present invention provides for a continuous spacer between the inner and outer cylinders wrapped in the shape of a helix such that a continuous passageway is formed for coolant flow.

The present invention provides for a cooling system for circulating a coolant to cool the patient bore. In one embodiment, that patient bore consists of two concentric cylinders separated by spacers running either longitudinally or helically. The gaps created between the spacers are then used to pass a cooling fluid such as air. If a cooling fluid other than air is used, it is generally directed into the gaps by a manifold and then collected by a second manifold at the other end so that it can be recycled. Materials such as perflourocarbon, which does not create an MR signal, can also be used instead of air.

In yet another embodiment of the present invention, fluid may be passed down tubes bonded to the outer diameter of the patient bore such that the parts of the bore that are exposed to the patient are directly cooled. Obviously, in the event that heating in the patient bore is asymmetric, the fluid path could be optimized to guide the fluid to those regions that require the most cooling. In yet a third embodiment, the RF coil could form part of the patient bore, with the helical fluid channels surrounding the patient bore.

The present invention also provides for a patient bore assembly having a climate control system comprised of a plurality of temperature sensors within the patient bore, said temperature sensors being electronically connected to a computer. The computer then regulates a coolant pump such that the flow of coolant is increased when the temperature sensors record higher temperatures and decreased when an appropriate temperature is reached.

BRIEF DESCRIPTION OF DRAWINGS

FIG. 4 is a top, right, cross-sectional perspective view of the second embodiment of the present invention showing a longitudinal orientation of cooling tubes.

FIG. 5 is a top, right, cross-sectional perspective view of the second embodiment of the present invention showing a helical orientation of cooling tubes.

DETAILED DESCRIPTION

Figure 1:
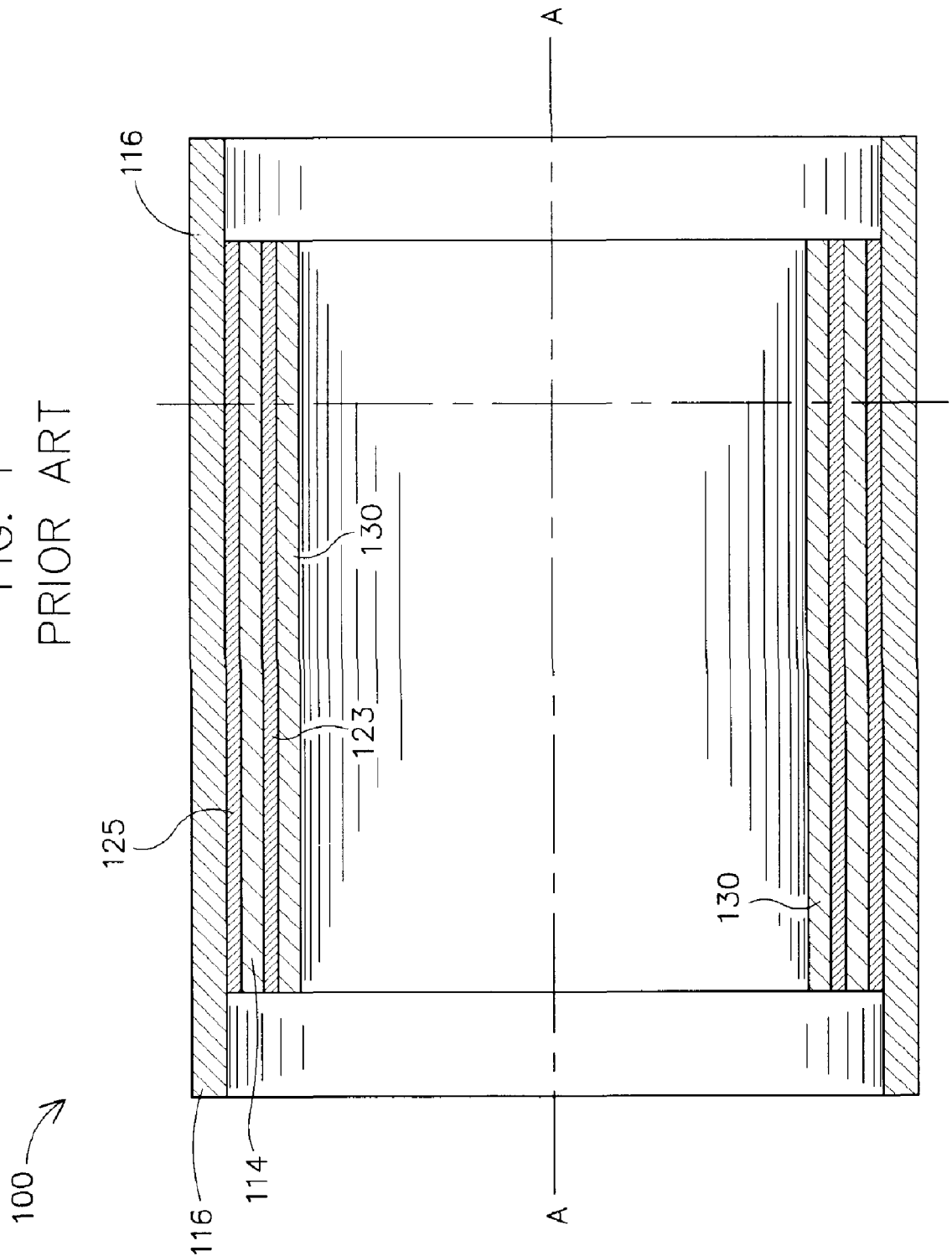
FIG. 1 is a sectional view, taken in a plane through the central longitudinal axis, of an MR gradient coil assembly of the prior art.
Figure 2:
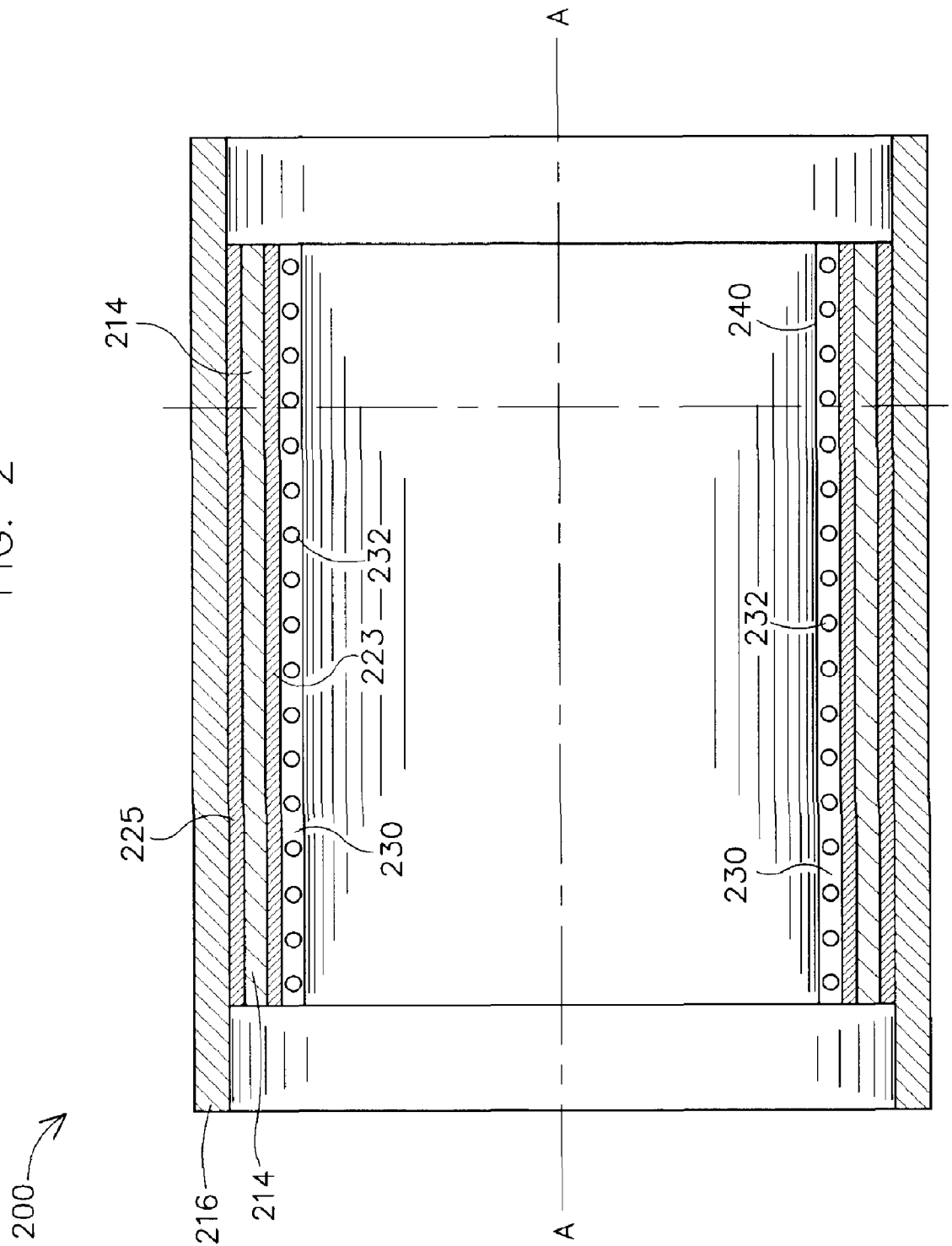
FIG. 2 is a sectional view, taken in a plane through the central longitudinal axis of the second embodiment of the present invention.

Referring now to the drawings in detail, wherein like numbered elements correspond to like elements throughout, FIG. 1 shows that portion of an MRI imaging system 100 comprising an RF coil 130, gradient coil 114, magnet 116 and patient bore surface of the prior art. Also shown in FIG. 1 is a dual layer of an epoxy-like material 123, 125, used to separate the conductive layers. FIG. 2 shows that portion of an MRI imaging system 200 comprising a magnet 216, gradient coil 214, patient bore surface 240 and RF magnet coil 230 for the MR imaging system of the present invention. Referring more specifically to the drawings, FIG. 2 shows a MRI assembly 200 for an MR imaging system (not shown), comprising an MR magnet 216, cylindrical gradient coil windings 214, and an RF coil 230 respectively, disposed in concentric arrangement with respect to common access A. Generally, continuous cooling tubes are wound in a helix through the gradient coil winding 214. The gradient coil windings 214 are held in radially spaced apart coaxial relationship, relative to each other and to the magnet 116 and the RF coil by an epoxy used for layers 223 and 225, said epoxy containing an alumina particulate material to increase its thermal conductivity.

Also shown in FIG. 2 is the patient bore enclosure 240 and the RF coil 230 inside of and concentric with the gradient coils 214. The RF coils 230 create the $B_1$ field which rotates the net magnetization in a pulse sequence. They also detect the transverse magnetization as it precesses in the XY plane. The magnetization of the RF coil 230 is achieved by passing a current through the coil, just as in the gradient coils 214. Obviously, this also causes resistive heating of the coils. The proximity of the RF coil 230 to the patient creates a high likelihood of patient discomfort, especially for large patients.

Figure 6:
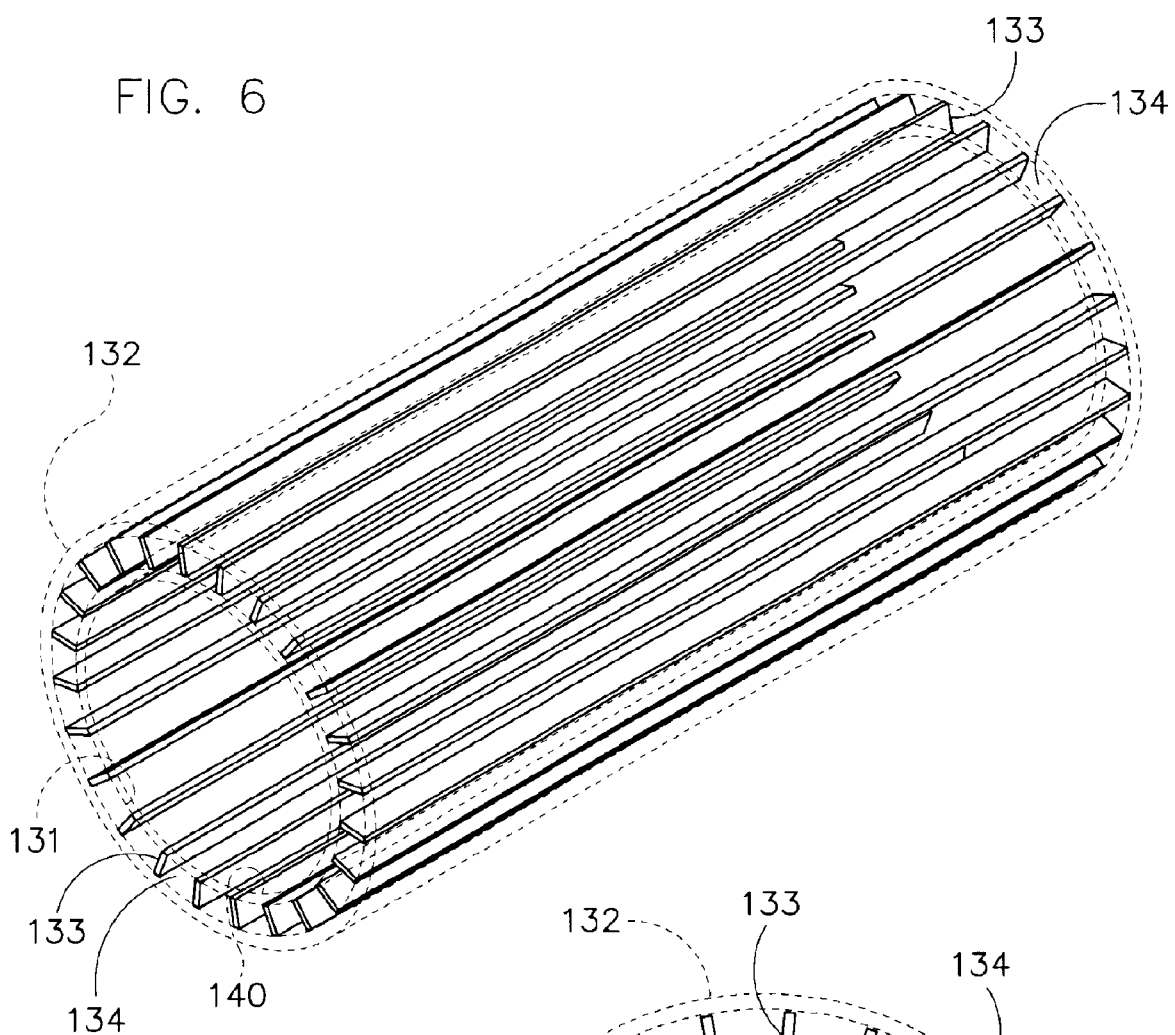
FIG. 6 is a top, right, cross-sectional perspective view of the first embodiment of the present invention showing cooling spaces oriented longitudinally.
Figure 7:
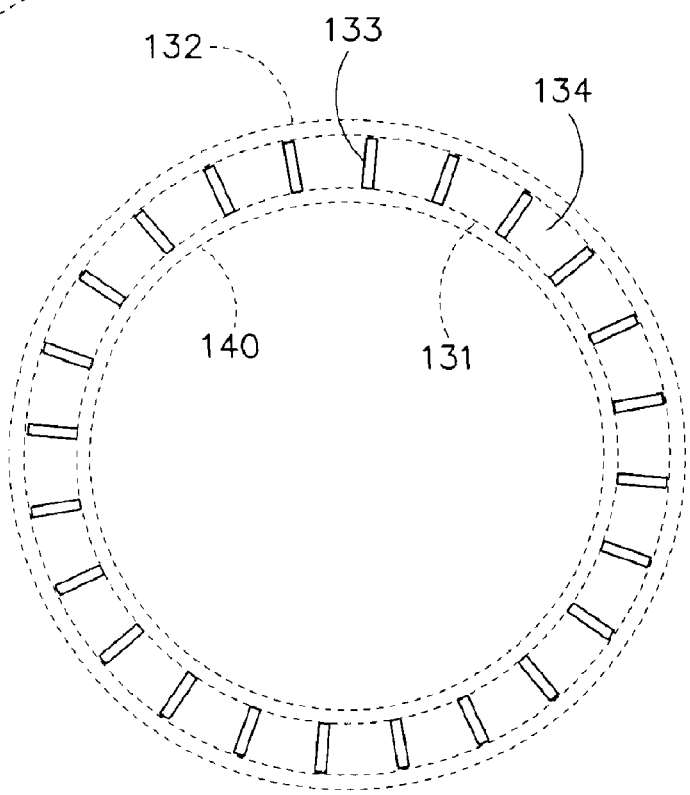
FIG. 7 is an elevational view of the first embodiment of the present invention.

Therefore, the first embodiment of the RF coil of the present invention, as shown in FIGS. 6 and 7 provides for a cooling channel between the RF coil 130 and the patient bore surface 140. This first embodiment provides an inner cylinder 131, a concentric outer cylinder 132, and a plurality of longitudinal spacers 133. The longitudinal spacers 133 connect the inner cylinder 131 to the outer cylinder 132. The apertures between the longitudinal spacers between the two concentric cylinders are used for coolant passageways 134. Also provided for by the present invention is a continuous helical spacer (not shown), that also connects the inner cylinder 131 to the outer cylinder 132 and provides for a passage of coolant through a helical passageway (not shown). The spacers, as well as the inner and outer cylinders, are typically manufactured from a composite material. The helical orientation of the spacers 135 as discussed above may increase the strength and rigidity of the patient bore tube 140. The gaps created by this arrangement are then used to pass a cooling fluid such as air, or some fluid that does not create an MR signal through them. The fluid would normally be directed into the cooling channels by a first manifold at one end and collected by a second manifold at the other end. Any type of manifold that distributes fluid in a generally even manner and collects the heated fluid could be used to perform this task and the type of manifold employed is not a limitation of the invention. Obviously, if air is used to cool the RF coil 130, no secondary manifold is required.

While not shown in particular, after the cooling fluid has circulated through the RF coil, it is collected in a manifold. Once in the manifold, generally a pump is used to first pump fluid through a heat exchanger to remove the heat due to resistive heating and to circulate fluid through the cooling channels.

The second embodiment of the present invention, as shown in FIG. 2 provides for a plurality of tubes bonded to the patient bore enclosure 240 between the patient bore enclosure 240 and the RF coil 230. As before, the cooling tubes 232 can be arranged in a helical or longitudinal relationship with the RF coil 230. Obviously, in this embodiment, no manifold is required to collect the coolant after it has passed through the cooling tubes 232, it is simply piped to a pump and through a heat exchanger and back through the cooling tubes 232.

Figure 3:
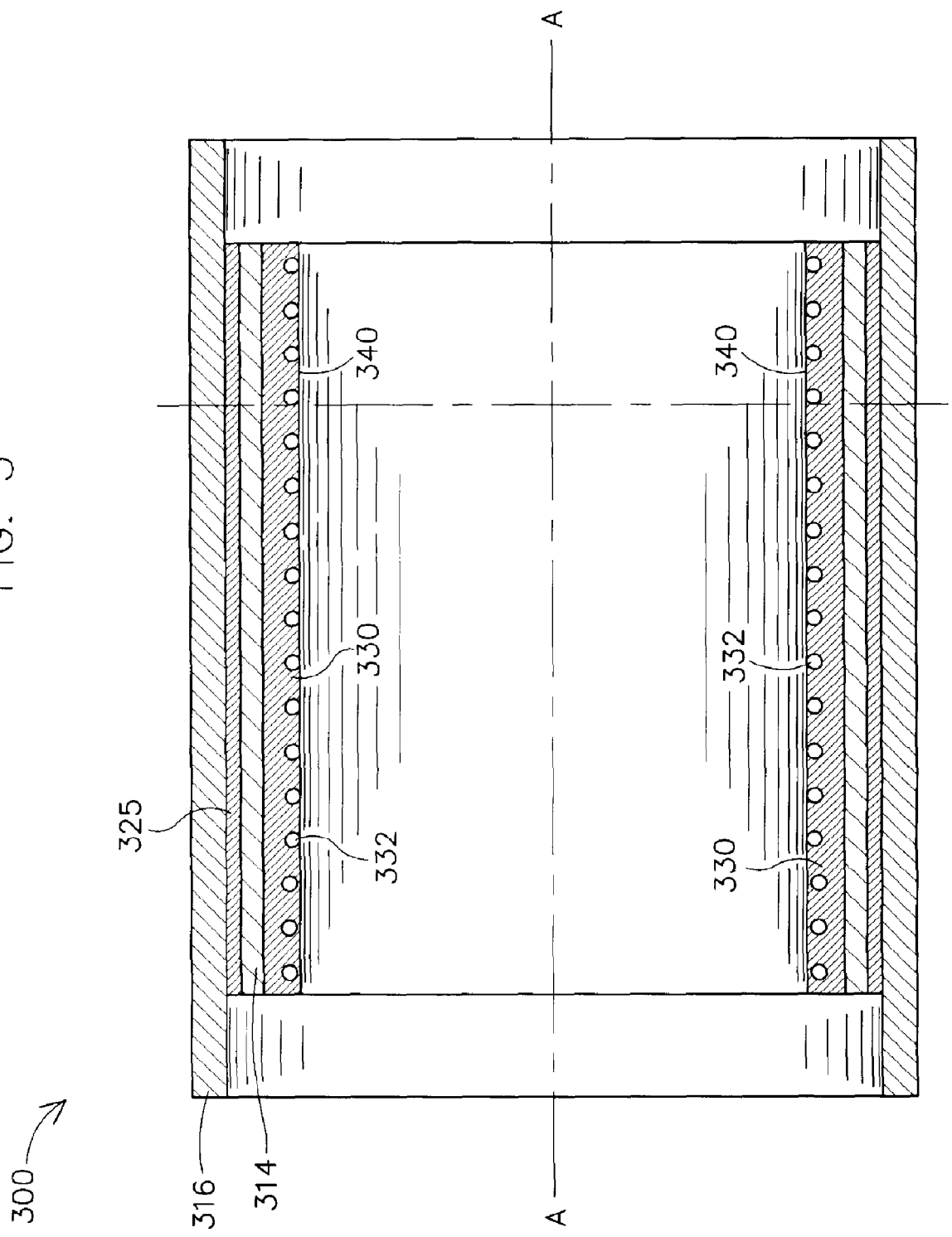
FIG. 3 is a sectional view, taken in a plane through the central longitudinal axis, of third embodiment of the present invention.

The third embodiment of the present invention 300, as shown in FIG. 3 again provides for an RF coil 330, a gradient coil 314, and a layer of epoxy 325 between the gradient coil 314 and the magnet 316. The third embodiment further provides for a plurality of cooling tubes 332 forming an integral part of the patient bore enclosure 340. The cooling tubes of this embodiment could also be arranged in either helical or longitudinal relationship with the RF coil. This third embodiment is the most space efficient embodiment of the present invention. Obviously, in any of the embodiments, the tubing can be designed such that coolant flow can be directed to areas in which heating is more intense.

FIG. 5 is exemplary of the first embodiment of the present invention and shows the longitudinal arrangement of cooling tubes 232. For comparison purposes, the helical arrangement of cooling tubes 232 as discussed regarding the second embodiment is depicted in FIG. 4.

The gradient coil 114, when generating a magnetic field, generates several kilowatts of heat due to the resistance of the copper coils. This heat must be dissipated for proper operation of the MRI machine and for comfort of the patient. As discussed above, a coolant, such as water, air, perflourocarbon, ethylene glycol, propylene glycol, or mixtures of any of the above, is circulated through the gradient coils. The coolant then carries the heat away from the RF coil. Although only a single inlet and a single outlet port is shown for coolant in FIGS. 4 and 5, in other embodiments there may be a plurality of inlet and outlet ports either because the cooling tubes/channels 134, 232, 332 are circular around the imaging volume, or because greater heat carrying capacity is required to remove the heat load caused by extended MRI studies.

There are many possibilities available that could be used to circulate coolant through the RF coil and it is intended that no particular method or apparatus should be a limitation of the invention. However, one possible way in which to provide a coolant circulation system is to provide a coolant pump to circulate coolant at a temperature dependent on system needs and, in accordance with the present invention.

Coolant entering the RF coil 130, 230, 330 travels through cooling tubes/channels 134, 232, 332 and while doing so absorbs heat from the coils. The coolant carrying the heat load is then drained away from the RF coil and exits to a heat exchanger. The heat exchanger is designed to dissipate heat absorbed from the coolant and lower the coolant temperature to a desired temperature dictated by the computer control (not shown).

The computer controller would take information from temperature sensors used to regulate the temperature of the patient bore. If the temperature sensors read a temperature that is above the desired level, the computer would send a signal to the pump to increase coolant flow. If the temperature falls below a specified value, the computer can decrease or halt the coolant flow, such as when the MRI is not operating.

Accordingly, an improved device for cooling the RF coil in an MRI magnet has been disclosed. The cooling system of the present invention provides a coolant pump for circulating coolant through around an RF coil 130. The coolant flow is regulated by a computer which receives information from a plurality of temperature sensors positioned within the patient bore 140. If the computer reads a temperature that is too high or lower than necessary, it sends a signal to the coolant pump to increase or decrease coolant flow.

It is to be further understood that the above-described invention for cooling the RF coil could be applied to open architecture MRI imaging systems. While not pictured open architecture MRI imaging systems include a patient bore surface, an RF coil and could further include cooling tubes attached to the patient bore enclosure or actually embedded within the RF coil.

Although we have very specifically described the preferred embodiments of the invention herein, it is to be understood that changes can be made to the improvements disclosed without departing from the scope of the invention. Therefore, it is to be understood that the scope of the invention is not to be overly limited by the specification and the drawings, but is to be determined by the broadest possible interpretation of the claims.

The invention claimed is:

1. A cooling system for an MRI device, the MRI device having a magnet, a set of gradient coils and an RF coil assembly defining a longitudinal cylindrical aperture in the MRI device, comprising:
   a cylindrical patient bore enclosure comprised of:
      a longitudinal outside cylinder, the outside cylinder having an inner wall and an outer wall, the outer wall of the outside cylinder being located inside the cylindrical aperture of the MRI device;
      a longitudinal inside cylinder, the inside cylinder having an interior wall providing the patient bore enclosure and having an exterior wall;
      a plurality of longitudinal cooling tubes interposed between the exterior wall of the inside cylinder and the interior wall of the outside cylinder; and
   a means for directing air through the cooling tubes to cool the patient bore enclosure.

2. A cooling system for an MRI device, the MRI device having a magnet, a set of gradient coils and an RF coil assembly defining a cylindrical aperture in the MRI device comprising:
   a cylindrical patient bore enclosure comprised of:
      an outside cylinder, the outside cylinder having an inner wall and an outer wall, the outer wall of the outside cylinder being located inside the cylindrical aperture of the MRI device;
      an inside cylinder, the inside cylinder having an interior wall providing the patient bore enclosure and having an exterior wall;
      at least one helical cooling tube interposed between the exterior wall of the inside cylinder and the interior wall of the outside cylinder; and
   a means for directing air through the at least one cooling tube to cool the patient bore enclosure.

3. A patient bore cooling assembly for an MR device, the MR device having a generally hollow cylindrical magnet space, a generally hollow cylindrical gradient coil space, within which a plurality of gradient coils are located, inside of which is a generally hollow cylindrical space within which an RF coil is located, comprising:
   a cylindrical patient bore enclosure located inside of the RF coil space comprised of:
      a longitudinal outside cylinder, the outside cylinder having an inner wall and an outer wall, the outer wall of the outside cylinder being inside the cylindrical aperture of the MRI device;
      a longitudinal inside cylinder, the inside cylinder providing an interior wall defining the patient bore enclosure and having an exterior wall;
      a plurality of longitudinal cooling tubes interposed between the exterior wall of the inside cylinder and the interior wall of the outside cylinder; and
   a means for directing air through the cooling tubes to cool the patient bore enclosure.

4. A patient bore cooling assembly for an MR device, the MR device having generally hollow cylindrical magnet space, a generally hollow cylindrical gradient coil space within which a plurality of gradient coils are located, inside of which is a generally hollow cylindrical space and within which the RF coil is located, comprising:
   a cylindrical patient bore enclosure located inside of the RF coil space comprised of:
      an outside cylinder, the outside cylinder having an inner wall and an outer wall, the outer wall of the outside cylinder being inside the cylindrical aperture of the MRI device;
      an inside cylinder, the inside cylinder providing an interior wall defining the patient bore enclosure and having an exterior wall;
      at least one helical cooling tube interposed between the exterior wall of the inner cylinder and the interior wall of the outside cylinder; and
   a means for directing air through the at least one cooling tube to cool the patient bore enclosure.

5. In an open architecture MR imaging system, the MR imaging system having a generally hollow cylindrical magnet space, a generally hollow cylindrical gradient coil space, within which a plurality of gradient coils are located, inside of which is a generally hollow cylindrical space within which an RF coil is located an RF coil assembly, comprising:
- a patient bore enclosure located inside of the RF coil space comprised of:
  - an outside cylinder, the outside cylinder having an inner wall and an outer wall, the outer wall of the outside cylinder being inside the cylindrical space of the MRI device;
  - an inside cylinder, the inside cylinder having an interior wall defining the patient bore enclosure and having an exterior wall
  - a plurality of cooling tubes interposed between the exterior wall of the inner cylinder and the interior wall of the outside cylinder; and
  - a means for directing air through the cooling tubes to cool the patient bore enclosure.

6. The open architecture MR imaging system of claim 5 wherein a plurality of cooling tubes are embedded within the RF coil.

* * * * *